United States Patent [19]

Swingley, Jr.

[11] Patent Number: 4,527,222
[45] Date of Patent: Jul. 2, 1985

[54] PRECISION TOTE BOX INSERT FOR HOLDING AND LOCATING PRINTED CIRCUIT BOARDS OR THE LIKE

[75] Inventor: Harold E. Swingley, Jr., Monona, Wis.

[73] Assignee: Menasha Corporation, Neenah, Wis.;

[21] Appl. No.: 469,506

[22] Filed: Feb. 24, 1983

[51] Int. Cl.³ .............................................. H05K 1/18
[52] U.S. Cl. .................................. 361/415; 206/334; 206/509; 220/22.5
[58] Field of Search ................ 361/415; 206/334, 509, 206/518; 220/22.2, 22.3, 22.4, 22.5; 211/41

[56] References Cited

U.S. PATENT DOCUMENTS

| | | | |
|---|---|---|---|
| 3,014,594 | 12/1961 | Kerstner | 206/334 |
| 3,311,863 | 3/1967 | Beale | 339/45 |
| 3,723,823 | 3/1973 | Lit et al. | 317/101 |
| 3,733,523 | 5/1973 | Reynolds et al. | 317/101 |
| 3,760,486 | 9/1973 | Rifkin et al. | 361/415 X |
| 3,798,507 | 3/1974 | Damon et al. | 317/101 |
| 3,838,777 | 10/1974 | Thornicroft et al. | 211/41 |
| 3,915,307 | 10/1975 | Agarde | 206/328 X |
| 4,002,381 | 1/1977 | Wagner et al. | 312/183 |
| 4,092,699 | 5/1978 | Petrangelo | 361/415 |
| 4,157,583 | 6/1979 | Basmajian et al. | 361/415 X |
| 4,158,876 | 6/1979 | Pedro | 361/415 |
| 4,277,121 | 7/1981 | Possati et al. | 312/320 |
| 4,328,898 | 5/1982 | Grassi | 211/41 |
| 4,404,615 | 9/1983 | Dep | 206/334 X |
| 4,426,675 | 1/1984 | Robinson et al. | 361/415 |
| 4,430,691 | 1/1984 | Rea | 361/415 X |
| 4,434,899 | 3/1984 | Rivkin | 361/415 X |

OTHER PUBLICATIONS

Jensen 1983–1984 Catalog, p. 103—published by Jensen Tools, Inc., Phoenix, Ariz., 1983.

Primary Examiner—R. R. Kucia
Attorney, Agent, or Firm—Quarles & Brady

[57] ABSTRACT

Robotic handling of printed circuit boards stored within a tote box is facilitated by the use of a structurally integrated insert within the tote box that is adjustable to accommodate boards of various widths and heights. The insert includes a locating element that extends through the tote box for contact by the locating apparatus of the robot and thus precisely establish the location of each circuit board.

20 Claims, 7 Drawing Figures

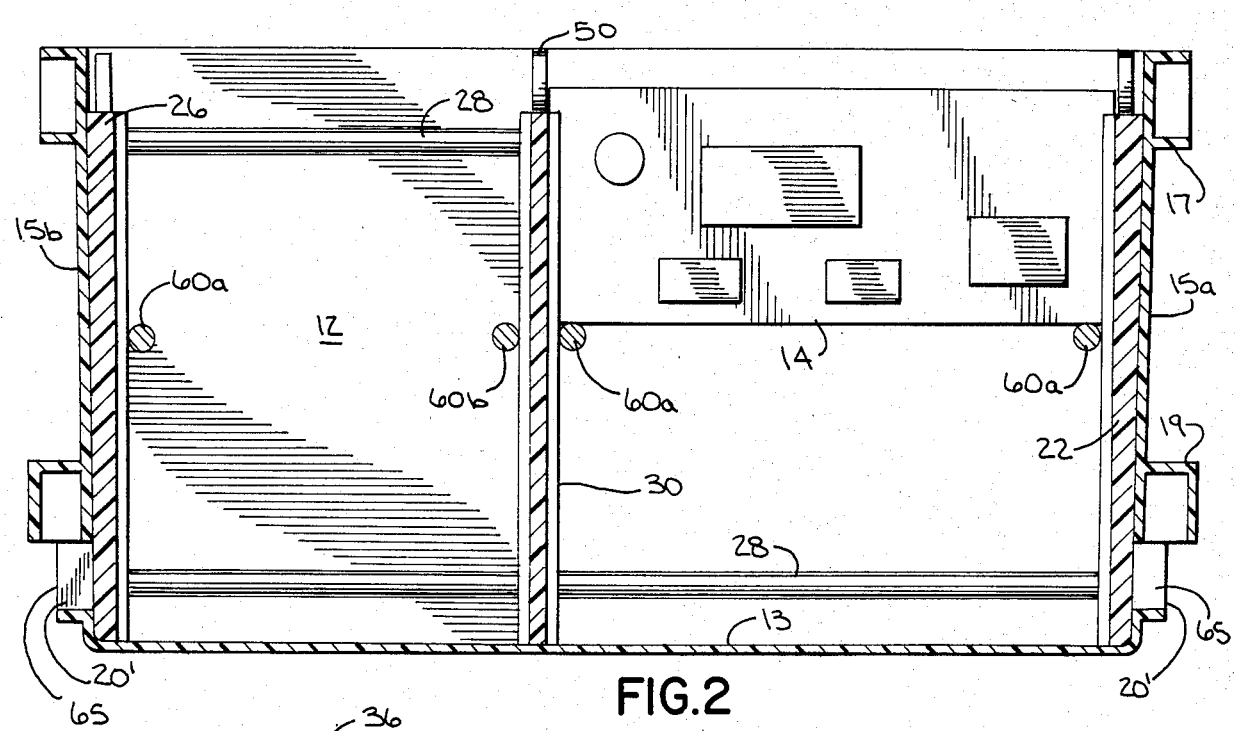
FIG.2
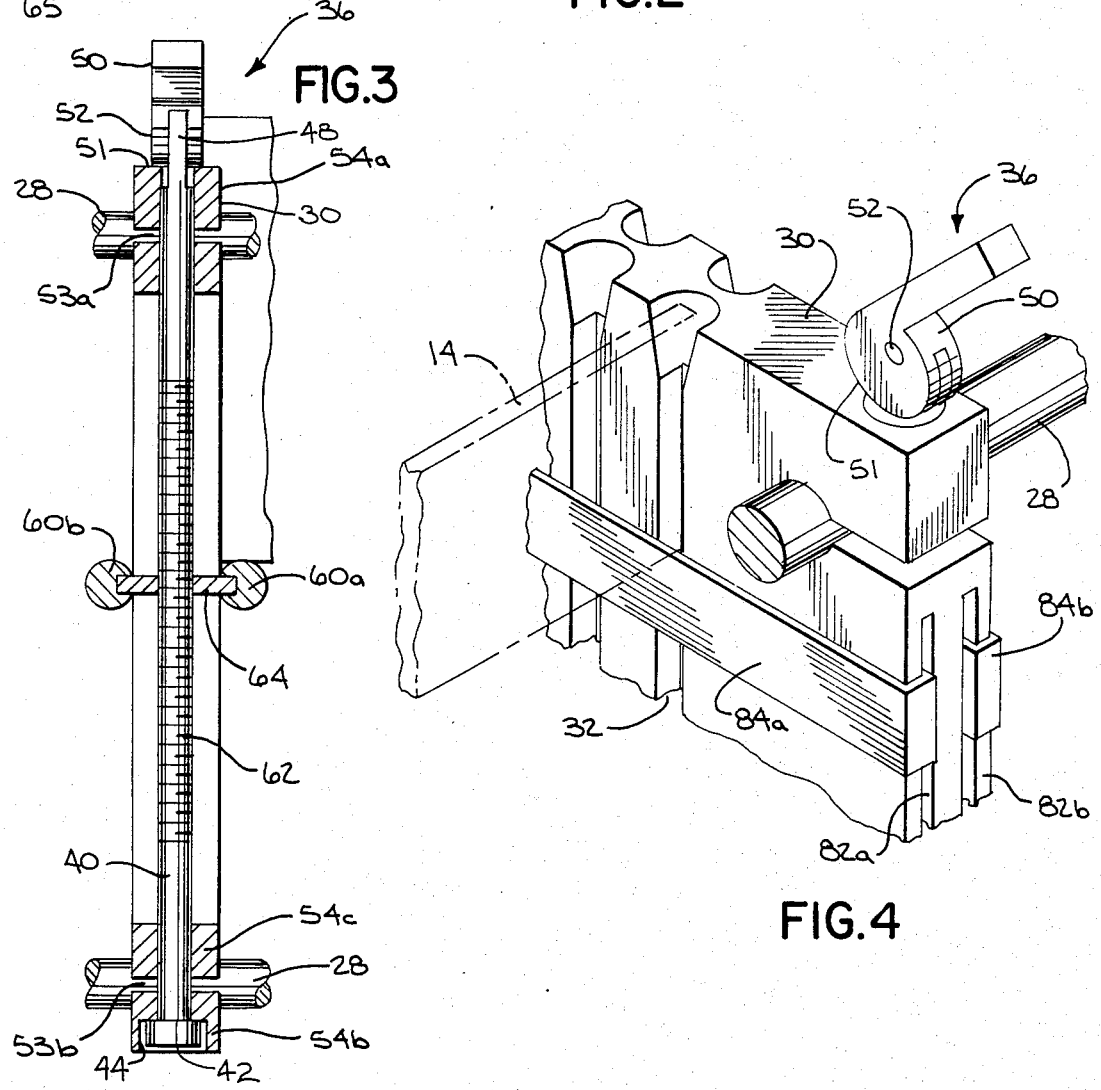
FIG.3
FIG.4

PRECISION TOTE BOX INSERT FOR HOLDING AND LOCATING PRINTED CIRCUIT BOARDS OR THE LIKE

BACKGROUND OF THE INVENTION

This invention relates to a precision insert receivable within a tote box for precisely locating and holding items to facilitate automated handling. A prime application is robotic handling of printed circuit boards, but other applications will be obvious.

In an effort to reduce direct labor assembly costs, many manufacturers are presently employing robots for inserting printed circuit boards into the appropriate location within electronic devices or testing or assembly devices. In order for a robot to successfully accomplish its task, the control system must be programmed to know both the precise location from which the printed circuit board is to be picked up, i.e., the storage location, and the location at which the printed circuit board is to be deposited.

Printed circuit boards are often transported in slotted plastic tote boxes in which they are held in edgewise fashion, and it is desirable to have the robot pick them up directly from the tote box. The plastic side walls of conventional tote boxes are not always precise because of manufacturing tolerances, or they may tend to become distorted after extended use. As a result, the location of the printed circuit boards within the tote box may not be precise or may tend to shift. The actual location of the circuit board to be inserted by the robot may then differ from the location of the printed circuit board known to the robot control system so that the robot may not properly grasp the desired circuit board, or may even grasp a different circuit board from that which is to be inserted in the desired location. This is a particular problem where a series of boxes must be handled and it is important to avoid inconsistencies from box to box.

In an effort to overcome these and other disadvantages associated with the storage of printed circuit boards within a plastic tote box, the present invention is specifically directed to a structurally integrated insert receivable within a tote box, and directly engageable by a locating device, for precisely locating and holding printed circuit boards to facilitate automated handling without regard to distortion or imperfections in the box.

BRIEF SUMMARY OF THE INVENTION

In accordance with the preferred embodiment of the invention, an improved printed circuit board holder for precisely locating and holding printed circuit boards comprises an insert which is receivable within a plastic tote box. The insert takes the form of an integrated frame having opposing, spaced apart slots for receiving opposite ends of a printed circuit board. Typically, the frame includes a fixed side wall and a movable wall which have slotted opposing faces to hold the circuit board in edgewise fashion. Both walls carry a height adjustment mechanism for precisely locating the top edges of the boards regardless of their height. Extending from the frame through an opening in the tote box wall is an exposed locating element which is engageable by the locating apparatus of a robot or automated circuit board handling device. The distance between the locating element on the frame and each of the printed circuit boards held by the frame is fixed so that once the locating element is contacted by the locating apparatus of the robot or automated printed circuit board handling device, the location of each printed circuit board held by the frame becomes known.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawings in which:

FIG. 1 is a perspective view of an insert which has been received within a tote box for precisely locating and holding printed circuit boards or the like;

FIG. 2 is a cross sectional view of the tote box and tote box insert taken along lines 2—2 of FIG. 1;

FIG. 3 is a cross sectional view taken along lines 3—3 of FIG. 1 illustrating a preferred embodiment of the locking mechanism and height adjustment mechanism utilized by the tote box insert of FIG. 1;

FIG. 4 shows an alternate preferred embodiment of a height adjustment mechanism which may be utilized with the tote box insert of FIG. 1 for varying the depth to which circuit boards are received within the insert;

DETAILED DESCRIPTION OF THE PREFERRED EMBODIMENTS

Figure 1:
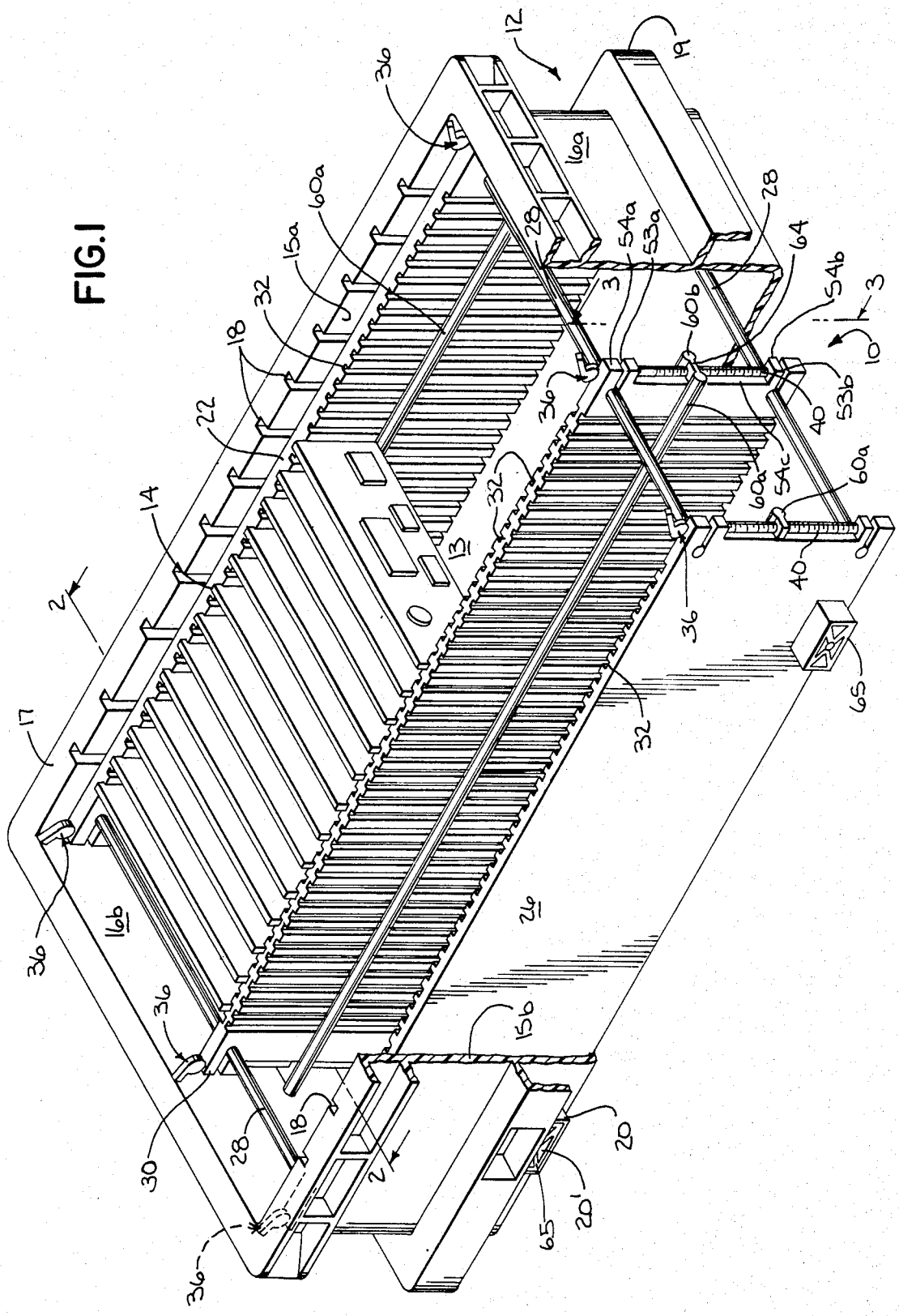

The figures, and especially FIG. 1, illustrate an improved precision insert 10 which is receivable within a tote box 12 for locating and holding printed circuit boards 14 to facilitate automated handling of the printed circuit boards by a robot or automated printed circuit board handler (not shown). The tote box 12 is preferably of molded plastic construction so as to have a bottom wall 13 and opposing side walls 15a and 15b and end walls 16a and 16b. An upper rim 17 circumscribes the top of walls 15a and 15b and 16a and 16c and the rim is provided with notches 18, which generally serve to secure a divider grid (not shown). A bumper rim 19 circumscribes the tote box walls beneath the level of the upper rim. Integrated both to the bumper rim and to each of the tote box side walls are a pair of stacking stops 20 (only one of which is shown), each stacking stop having a drain opening 20' extending therethrough. The tote box 12 thus far described is identical to that disclosed in the copending application Ser. No. 469,439 filed Feb. 24, 1983 and assigned to the same corporate assignee. While this particular configuration is preferred, it will be obvious that the invention is applicable to other tote box configurations.

The tote box insert 10 is comprised of a stationary side member 22 which takes the form of a wall which is dimensioned to be of a length slightly less than the inside length dimension of the tote box 12. The wall 22 fits against the side wall 15a of the tote box 12, and is held against shifting by the locating elements described below. Opposite to wall 22 is a second frame member 26 which runs along the tote box side wall 15b. Preferably member 26 is a mirror image of wall 22 but could be a simple C or other frame member. Like wall 22, wall 26 has a a pair of protruding locating elements (described below) which extend outwardly through the tote box wall 15b.

Four separate cross struts 28 (only three of which are shown) extend into corresponding strut receiving passageways near the respective corners of the walls 22, 26 for locking to the walls. In practice, each strut 28 takes the form of a rod having a smooth outer surface. To assemble the frame and box, the walls 22, 26 are slid inwardly, the frame is then put into the box, and the walls 22, 26 are finally slid outwardly against the side walls 15a, 15b and locked.

Interposed between walls 22, 26 is a movable medial wall 30. Movable wall 30 has an opening at each of its corners to allow the rods 28 to extend therethrough to enable the movable wall 30 to move along rods 28 between walls 22 and 26.

Each of the opposing faces of movable wall 30 and stationary walls 22 and 26 is provided with vertically extending, parallel spaced slots 32. Each of the slots 32 on walls 22 and 26 is in alignment with a slot on the opposing face of wall 30 and is dimensioned to receive a separate one of the lateral edges of a circuit board 14. In the preferred embodiment shown, the circuit boards 14 are held between walls 22 and 30. They could be held between walls 26 and 30, or a second medial wall could be added to accommodate two rows of circuit boards. Since medial wall 30 is movable along the rods 28, circuit boards of different lengths may be accommodated.

Once movable wall 30 is positioned along rods 28 a preset distance from wall 22 to accommodate the particular length of circuit boards 14, then wall 30 is locked to rods 28 by a locking mechanism 36 at each end of the wall. Referring now jointly to FIGS. 1 and 3, each locking mechanism 36 includes a shaft 40 which extends vertically through the wall 30 outwardly of the wall passages receiving rods 28. The lower end of shaft 40 is provided with a head 42 which seats in a counter bore 44 in the base of wall 30. The upper flattened end 48 of shaft 40 fits within a complementary recess in the base of a lever 50 having a bottom cam surface 51. A pin 52 extends horizontally through the lever 50 and the flattened end 48 of shaft 40 off center of the cam surface 51.

A pair of slots 53a and 53b are each cut into the edge of wall 30 near the top and bottom of the wall so as to extend horizontally through the wall for communication with each of the rod receiving passageways near the wall corner. The slots 53a and 53b partially bifurcate the edge of wall 30 into an upper and lower pincer members 54a and 54b and a central edge portion 54c as best illustrated in FIG. 3. When the lever 50 is pressed downwardly, pincer members 54a and 54b are urged towards one another to pinch the upper and lower rods 28. In this way, the locking mechanism generally 36 secures wall 30 to the rods 28 to prevent lateral movement of wall 30.

The central shaft 40 of the locking mechanism 36 at each end of wall 30 also serves to raise and lower the bars 60a and 60b which run horizontally across each of the faces of wall 30. Referring now to FIG. 1, a major part of the central edge portion 54c of each edge of the wall 30 is cut away, thereby exposing the central threaded section 62 body of the shaft 40. A flat nut 64, such as a Timmerman nut, is threaded on to shaft 40 and moves up or down depending on which way the shaft 40 is rotated. The nut 64 receives the ends of bars 60a and 60b so that end of each bar moves up or down with the nut 64. By appropriate adjustment of the central shaft 40 of the locking mechanism 36 at each end of wall 30, the height of bars 60a and 60b can be set as desired. The desirability of having a pair of bars each running horizontally along each exposed face of wall 30 is apparent when the wall 30 is interposed between a pair of slotted side walls. If only one slotted side wall is present, then the movable wall 30 need only carry a single horizontal bar.

Referring now to FIG. 1, the rods 28 are also locked to the stationary walls 22 and 26 in the same way as the rods 28 are locked to wall 30 by each of a pair of locking mechanisms 36 identical to that described earlier. The central shaft 40 of the locking mechanism 36 at each end of the walls 22 and 26 cooperates with a single bar 60a which runs horizontally across the exposed face of the walls. The single bar 60a is raised and lowered in exactly the same way that bars 60a and 60b are raised and lowered on the wall 30. It is important to note that the bar on the fixed walls is adjustable independently of the corresponding bar on the medial wall 30 to accommodate circuit boards which are not even across the bottom. While the locking mechanism shown for the walls 22, 26 in FIG. 1 is suitable, it may be preferable to substitute a simpler arrangement where these walls are held between conventional E-rings received in grooves in the rods 28.

An important feature of tote box 10 is not only its ability to hold a plurality of circuit boards 14 therein but also its ability to precisely locate each circuit board within the insert. To this end, both wall 22 and 26 are provided with at least one locating element 65 which protrudes outwardly through the drain opening 20' in the stacking stop 20 on the tote box side wall so as to be exposed to the environment. Although wall 30 is movable between walls 22 and 26, the wall 22 and the wall 26 are relatively stationary and integrated so that the distance between them will not change. Each of the slots 32 in walls 22 and 26 is a fixed distance from each adjacent slot and therefore the distance between each slot and the locating element 65 does not change.

Once the conventional locating apparatus (not shown) of a robot or automated circuit board handler contacts the lug or locating element 65 on one of the walls, then the coordinates of locating element become known to the robot or the automated circuit board handler. The distance between each circuit board slot and the locating element is fixed and can be programmed into the robot or automated circuit board handler. With information obtained from the locating apparatus regarding the coordinates of the locating element 65 and the programmed information regarding the dimensions of insert 10 and the circuit board dimensions, the robot or automated circuit board handler can know the exact location of each circuit board 14 held within insert 10.

FIG. 4 illustrates an alternate preferred height adjustment mechanism for use with the wall 30 of the tote box insert 10 of FIGS. 1-3. In contrast to the height adjustment mechanism of FIGS. 1-3 which utilizes the central shaft 40 (FIGS. 1 and 3) of the locking mechanism 36 for raising and lowering the bars 60a and 60b, the height adjustment mechanism illustrated in FIG. 4 operates independently of the locking mechanism 36 and thus, the central portion 54c of each edge of wall 30 is not cut away to expose the shaft of the locking mechanism 36. Rather, the central edge portion 54c is provided with a pair of vertically extending slots 82a and 82b for accommodating the hooked end of each of a pair of strips 84a and 84b which run horizontally along each of the faces of the wall 30. Each of strips 84a and 84b is vertically slidable along the wall face to enable adjustment of the circuit board depth. Once the edge of a circuit board 14 is inserted into one of slots 32 of wall 30, the weight of the circuit board against the corresponding one of strips 84a and 84b causes the strip to cock or tip with respect to the face of the wall 30 to wedge the strip and hence prevent the strip from sliding downwardly. Although not shown, the height adjustment mechanism described with respect to FIG. 4 may also be utilized with walls 26, 30 or 22 in place of the height adjustment mechanism described previously with respect to FIGS. 1–3.

Figure 5:
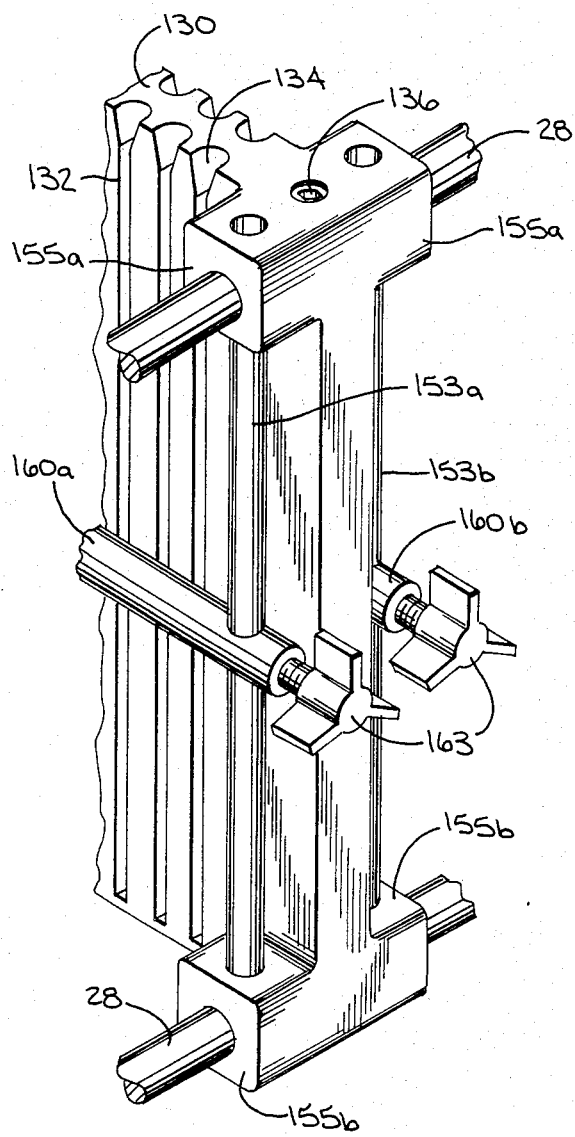
FIG. 5 is a partial perspective view of another preferred embodiment of the movable central wall for the tote box insert together with the associated locking mechanism and height adjustment mechanism.

To reduce the fabrication cost of insert 10 each of the walls 26, 22 and 30 can be formed from structural plastic rather than a metal such as aluminum described. Substitution of plastic for aluminum does, however, necessitate some differences in wall construction. FIG. 5 illustrates a plastic central wall 130 which may be substituted in place of aluminum wall 30 of FIGS. 1–3. Plastic wall 130 is provided with vertically extending, spaced apart slots 132 in each face in much the same way that wall 30 of FIGS. 1–3 is provided with slots 32. The upper end of slots 132 are conically flared at 134 to more readily facilitate circuit board insertion; the conical configuration eliminates edges that might catch the circuit boards and is actually preferred for all embodiments of the invention even if not shown.

Rather than employ a relatively complex locking mechanism such as locking mechanism 36 of FIGS. 1 and 3, the plastic wall 130 is provided with but a single set screw 136. The set screw is threaded into the top wall 130 to bear against the upper rod 28 thereby locking the wall 130 to the upper rod. Although the set screw 136 only serves to lock the upper rod 28 to the wall, the rods are guided through the wall by outwardly extending projections 155a and 155b (described below) so that tilting of the wall is unlikely. Thus, a single set screw has been found to be sufficient to prevent wall movement.

The height adjustment mechanism associated with plastic wall 130 of FIG. 5 for limiting the circuit board depth in the wall slots also differs from the height adjustment mechanism described previously with respect to FIGS. 1–3 and FIG. 4. The circuit board height adjustment mechanism provided at each end of wall 130 includes a pair of vertical rails 153a and 153b, each slightly shorter than the distance between the upper and lower rods 28. Each of rails 153a and 153b is supported at its upper and lower ends by a separate one of a pair of upper wall projections 155a and lower wall projections 155b, the wall projections of each pair extending normally from the wall face at a wall corner in opposite directions. In addition to supporting each of rails 153a and 153b, the upper pair of oppositely extending wall projections 155a and the lower pair of oppositely extending wall projections 155b additionally serve to guide the upper and lower rods 28 passing through the wall corners past the ends of the vertical rails.

Each of rails 153a and 153b passes through an opening adjacent to an end of each of bars 160a and 160b which extend horizontally across the faces of the wall 130. The openings in each bar receiving the vertical rail is slightly larger than the rail so that each bar can move vertically along its guide rails. A thumb screw 163 is threaded to the end of each of bars 160a and 160b to lock the end of each bar to each rail once the circuit board depth has been set.

A plastic version of stationary wall 26 would be constructed in much the same manner as wall 130 except that only the exposed face of the wall would be provided with upper and lower outwardly extending wall protrusions 155a and 155b at the wall corners. Accordingly, the height adjustment mechanism would include but a single pair of vertical rails and a single horizontal circuit board supporting bar slidably mounted at each end to one of the rails. The remaining features of wall 130 such as the locking set screw 136 would be incorporated in the plastic version of wall 26.

Figure 6:
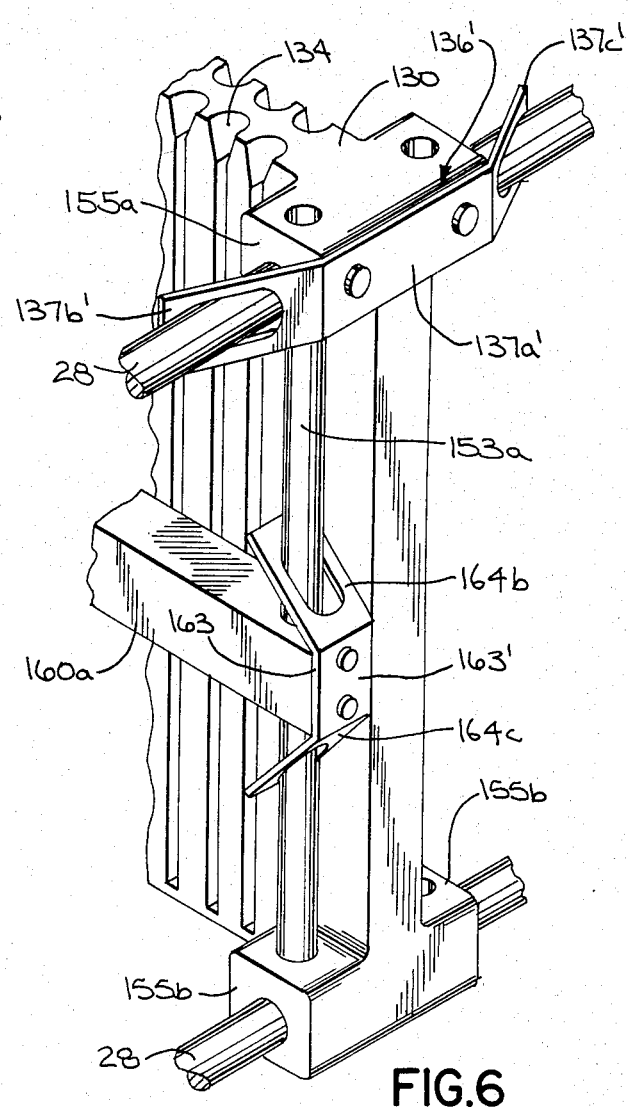
FIG. 6 is a second alternate preferred embodiment of the movable central wall and the associated locking mechanism and height adjustment mechanism.

FIG. 6 illustrates a plastic wall 130 similar to that shown in FIG. 5 and thus like numerals are utilized to describe like elements. However, instead of employing a set screw such as set screw 136 to lock the wall to the upper rod 28, a spring clip 136' is preferably employed with the wall 130 of FIG. 6 to lock the wall to the rod. Spring clip generally 136' includes a central body 137a' attached to the edge of the wall integral with the opposing, outwardly extending upper wall protrusions 155a. Extending outwardly from the central spring body 137a' of the spring clip are a pair of opposing arms 137b' and 137c'. Each arm has an aperture for allowing the upper rod 28 to pass therethrough. The angle of the arms with respect to the central body section is such that the arms 137b' and 137c' bear against the upper rod 28 to prevent wall movement. Only when the spring arms 137b' and 137c' are pressed inwardly can the wall 130 be moved along the rod.

Rather than employing the thumb screw 163 to lock the end of each of bars 160a and 160b as illustrated to rails 153a and 153b in FIG. 5, a spring clip 163' having a central body 163 and opposing arms 164b and 164c similar to spring clip 136' may be employed instead as illustrated in FIG. 6. To more easily utilize a spring clip 163', the bars such as 160a are made of rectangular cross sectional area rather than circular area as illustrated in FIG. 5. Each spring clip 163' locks the end of each of bars to the vertical rail 153a until the arms 164b and 164c of the spring clip are depressed in much the same way that spring clip 136' locks the wall 130 to rods 28.

Figure 7:
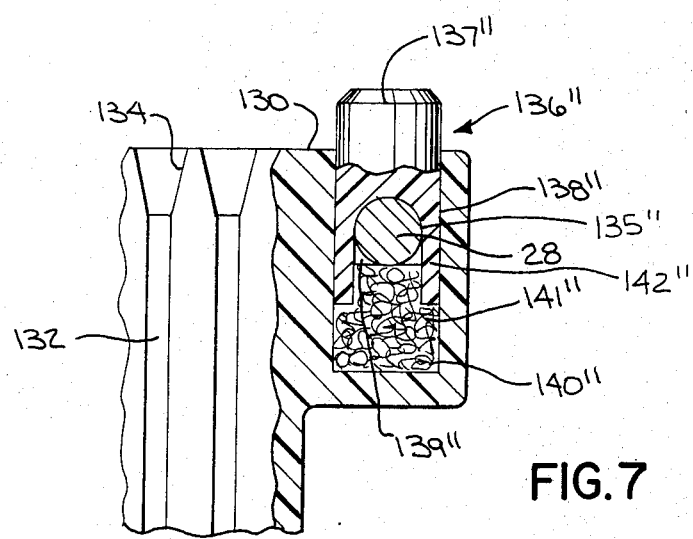
FIG. 7 is a cross sectional view illustrating an alternate preferred locking mechanism for locking the movable central wall of the tote box insert.

FIG. 7 illustrates yet another embodiment 136" of a locking mechanism for locking the wall 130 to rod 28 to prevent movement of the wall along the rod. The locking mechanism 136" includes a plug 137" which is received in a vertically disposed wall passageway 138" and has a cross bore 135" aligned with the horizontal rod 28 to provide a receiving passageway between fingers 142". Plug 137" has a bottom central vertical opening 139" therethrough. A compressible foam rubber plus 140" is disposed below the plug 137" and has a reduced upper portion 141" that extends through the opening 139" to bear against the rod 28 and hold it in place by friction. When plug 137" is pushed downwardly against foam rubber plug 140" the plug 140" is compressed downwardly out of engagement with the rod 28 with the compression of plug 140" acting as a spring means. The wall 130 can then be easily moved along the rod.

The foregoing describes an improved insert receivable within a tote box for precisely locating and storing printed circuit boards to facilitate automated handling of the printed circuit boards by a robot or the like.

While only certain preferred features of the invention have been shown by way of illustration, many modifications or changes will occur to those skilled in the art. It is, therefore, to be understood that the appended claims are intended to cover all such modifications and changes as fall within the true spirit of the invention.

What is claimed is:

1. In combination with a tote box, insert for precisely locating and holding printed circuit boards, said insert comprising:
   a frame receivable within the box to be freely carried therein for holding and storing printed circuit boards; and
   at least one locating element on the frame extending through the tote box in an unsecured manner so as to be exposed relative to the tote box, said locating element being constructed and arranged to provide for direct engagement by an external work station apparatus.

2. The invention according to claim 1 wherein said frame comprises:
   a first wall having at least one vertically extending slot in the exposed face for receiving one edge of a printed circuit board;
   a second wall parallel to, but spaced apart from said first wall;
   a plurality of cross struts extending between said first and second walls;
   a medial wall having strut receiving passageways for receiving said cross struts so that said medial wall is slidable along said cross struts toward and away from one of said walls, said medial wall having at least one vertically extending slot in the face thereof opposing one of said walls for receiving the other of the edges of the printed circuit board; and
   a locking mechanism on said medial wall engageable with the struts to lock the medial wall to the cross struts at a selected spacing from one of said walls to said cross struts.

3. The invention according to claim 2 wherein each said first and second walls comprise side walls and said side and medial walls carry height adjusters on their facing surfaces for adjusting the depth to which a circuit board is received within the slots in said walls.

4. The invention according to claim 3 wherein said locking mechanism comprises:
   strut receiving passageways defined by said walls;
   a pair of slots in each edge of the side walls adjacent to the top and bottom of said side walls so as to communicate with the strut receiving passageways through said side walls, said slots partially bifurcating each edge of the side wall into an upper and lower pincer and a central edge portion;
   a shaft having a head at one end and a flattened end at the other, said shaft vertically disposed through said side wall outwardly of the strut receiving passageways so that the head of said shaft bears against the lower pincer and said flattened shaft and extends through the upper pincer;
   a locking cam which has a recess therein for receiving the flattened end of said shaft so that said locking cam bears against said upper pincer; and
   said locking cam connected to said shaft so that when actuated, said locking cam causes said pincers to be urged towards one another to lock the side walls to the cross struts.

5. The invention according to claim 2 wherein said locking mechanism comprises a set screw threaded through one of the walls to bear against a cross strut.

6. The invention according to claim 2 wherein said locking mechanism comprises a spring clip having a central body portion secured to one of said walls and at least one outwardly extending arm having an aperture for receiving one of said cross struts so that said arm bears against said cross strut.

7. The invention according to claim 3 wherein said height adjustment mechanism comprises:
   at least one vertically extending passage in each edge of the side wall;
   at least one strip having hooks at each end thereof, said strip extending horizontally across the face of the side wall and the hooked ends of said strip each engaging each of said passages so that said strip may move freely up and down until the weight of a circuit board against said strip causes said strip to become cocked to prevent strip movement.

8. The invention according to claim 3 wherein said height adjustment mechanism comprises:
   a pair of threaded rods, each vertically extending through a separate one of the edges of one of said side walls so that the threads on each of said rods are exposed;
   a pair of threaded members each carried by each of said rods so as to move vertically along said rods upon rod rotation; and
   a bar extending horizontally along the face of one of said side walls outwardly from said side wall slot, each end of said bar secured to each of said threaded members on each of said threaded rods so that said bar is moved vertically upon rotation of each of said threaded rods.

9. The invention according to claim 3 wherein said height adjustment means comprises:
   a circuit board supporting bar extending horizontally across the face of one of said side walls;
   first and second vertically oriented guides mounted at each end of one of said side walls so as to be outwardly of said side wall for slidably supporting each end of said bar; and
   locking means for locking each end of said circuit board supporting bar to a separate one of said first and second vertical guides.

10. The invention according to claim 9 wherein said locking means comprises a thumb screw threaded into each end of said circuit board supporting bar for locking said circuit board supporting member to a separate one of said first and second vertical guides.

11. The invention according to claim 9 wherein said locking means comprises a spring clip mounted to each end of said circuit board supporting member for yieldably engaging each of said first and second vertically oriented guides.

12. The invention according to claim 2 wherein said locking mechanism comprises:
   a plug seated in a passageway within one of said side walls, said plug having a central vertical bore and an intersecting horizontal strut receiving passageway sized larger than said strut to allow for reciprocal plug movement;
   spring means sealed in said passageway beneath said plug, said spring means having a reduced diameter upper portion seated in said plug vertical bore to bear against said strut until such time as said plug is urged into said passageway to yieldably deform said spring to displace said upper portion of said spring away from said strut.

13. The invention according to claim 2 wherein each of said slots in said walls has a conical flare at its upper end.

14. The invention according to claim 1 wherein said tote box defines a stacking stop and said locating element extends into said stacking stop.

15. In combination with a tote box, an insert receivable within and to be freely carried by said tote box for holding printed circuit boards, said insert including:
   side portions at opposite sides of the tote box;
   cross struts extending between the ends of said side portions of said insert;
   at least one said side portion provided with vertically extending holding grooves in an exposed face thereof;
   a medial wall slidably mounted on said cross struts so as to be parallel to and facing said side portions, said medial wall provided on its surface facing said one of said side portions with vertically disposed grooves each opposite to and aligned with a corresponding one of the grooves on said one side portion;
   means for locking said medial wall to said cross struts;
   support bars extending horizontally along the facing surfaces of said one said side portions and medial wall and slidably mounted to each of said one side portion and said medial wall for vertical movement therealong;
   means on each of said medial wall and said side portions for raising and lowering said support bars; and
   a locating element mounted on said one of said side portions so as to extend outwardly of said tote box in an unsecured manner, said locating element being constructed and arranged to provide for direct engagement by an external work station apparatus.

16. The invention according to claim 15 wherein each said side portion to provided with at least a pair of lugs which each extend from said side portion to engage the tote box and define said locating element.

17. The invention according to claim 15 wherein said means for locking said medial wall to said cross strus comprises:
   strut receiving passages defined by said side portions;
   a pair of slots in the edge of the side portions adjacent to the top and bottom of said side portions so as to communicate with the strut receiving passage through said side portions, said slots bifuricating each edge of the side portion into an upper and lower pincer and a central edge portion;
   a shaft having a head at one end and a flattened portion at its opposite end, said shaft vertically disposed through said side portion outwardly of the passages through the side wall corners receiving said rods so that the head of said shaft bears against the lower pincer and said flattened shaft and extends through the upper pincer;
   a release lever having a cammed outer surface which has a recess therein for receiving the flattened end of said shaft; and
   a pin extending through said release lever and said flattened shaft end off center of the cammed surface so that said release lever, when actuated causes said pincers to be urged towards one another to lock the side portion to the cross struts.

18. The invention according to claim 15 wherein said means for raising and lowering said support bars comprises
   a pair of threaded rods, each rod disposed through an end of said side portions and said medial wall so that a portion of the threads on each rod is exposed; and
   a pair of nuts each carried by each said threaded rods and each engaging the end of a support bar to displace said support bar vertically along said rods when said threaded rod is rotated.

19. The invention according to claim 15 wherein said means for locking said medial wall comprises:
   a plug seated in a passageway within said side portions for reciprocal movement to and from the corresponding one of said cross struts passing through said wall;
   a pair of inwardly tapered fingers depending from said plug for engaging one of said cross struts only when said plug is urged upwardly; and
   spring means for resiliently urging said plug upwardly so that said inwardly tapered fingers firmly engage said cross strut.

20. The invention according to claim 15 wherein said means for locking said medial wall comprises a set screw.

* * * * *